US009537471B2

(12) United States Patent
Kamal

(10) Patent No.: US 9,537,471 B2
(45) Date of Patent: Jan. 3, 2017

(54) THREE DIMENSIONAL LOGIC CIRCUIT

(71) Applicant: QUALCOMM Incorporated, San Diego, CA (US)

(72) Inventor: Pratyush Kamal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/617,885

(22) Filed: Feb. 9, 2015

(65) Prior Publication Data
US 2016/0233853 A1    Aug. 11, 2016

(51) Int. Cl.
H03K 3/356 (2006.01)
H03K 3/012 (2006.01)
H03K 3/3562 (2006.01)
G11C 19/28 (2006.01)
H01L 27/06 (2006.01)
G11C 19/34 (2006.01)

(52) U.S. Cl.
CPC ......... *H03K 3/356182* (2013.01); *G11C 19/28* (2013.01); *G11C 19/34* (2013.01); *H01L 27/0688* (2013.01); *H03K 3/012* (2013.01); *H03K 3/35606* (2013.01); *H03K 3/35625* (2013.01)

(58) Field of Classification Search
CPC ............. H03K 3/012; H03K 3/356182; H03K 3/35625
USPC .................. 327/199, 200, 201, 202
See application file for complete search history.

(56) References Cited

U.S. PATENT DOCUMENTS

| 4,829,018 | A | 5/1989 | Wahlstrom | |
| 6,822,478 | B2 * | 11/2004 | Elappuparackal | G06F 1/04 326/46 |
| 8,574,929 | B1 | 11/2013 | Or-Bach et al. | |
| 8,709,880 | B2 | 4/2014 | Or-Bach et al. | |
| 9,013,235 | B2 * | 4/2015 | Kamal | G06F 17/5068 327/564 |
| 2003/0178228 | A1 | 9/2003 | Sung et al. | |
| 2012/0196390 | A1 | 8/2012 | Or-Bach et al. | |
| 2014/0125377 | A1 | 5/2014 | Lin et al. | |
| 2014/0146630 | A1 * | 5/2014 | Xie | G06F 1/32 365/226 |
| 2014/0253196 | A1 | 9/2014 | Du et al. | |

(Continued)

OTHER PUBLICATIONS

Shyu Y.T., et al., "Effective and Efficient Approach for Power Reduction by Using Multi-Bit Flip-Flops," IEEE Transactions on Very Large Scale Integration (VLSI) Systems, Apr. 2013, vol. 21 (4), pp. 624-635.

(Continued)

*Primary Examiner* — John Poos
(74) *Attorney, Agent, or Firm* — Muncy, Geissler, Olds & Lowe, P.C.

(57) ABSTRACT

A 3D multi-bit flip-flop may include a two tier structure. The two tier structure may include a first tier containing a common clock circuit for the multi-bit flip-flop as well as the clock driven portions of the individual flip-flops and a second tier containing a common scan circuit for the multi-bit flip-flop as well as the non-clock driven portions of the individual flip-flops. Alternatively, the first tier may include the common clock circuit as well as a portion of the individual flip-flops and the second tier may include the common scan circuit as well as the other portion of the individual flip-flops.

18 Claims, 5 Drawing Sheets

(56) References Cited

U.S. PATENT DOCUMENTS

2014/0269022 A1    9/2014  Xie et al.

OTHER PUBLICATIONS

"The Monolithic 3D Advantage," 3D IC Edge—Monolithic 3D Inc., the Next Generation 3D-IC Company, Copyright date: Jan. 1, 2012, Retrieved date on May 21, 2014, Retrieved from the Internet < URL: http://www.monolithic3d.com/3d-ic-edge.html >, 12 Pages.
International Search Report and Written Opinion—PCT/US2016/014037—ISA/EPO—Jul. 29, 2016.
Noia, et al., "Pre-Bond Probing of TSVs in 3D Stacked ICs", IEEE International Test Conference, 2011, 10 pgs.

* cited by examiner

THREE DIMENSIONAL LOGIC CIRCUIT

FIELD OF DISCLOSURE

This disclosure relates generally to three dimensional (3D) logic circuits, and more specifically, but not exclusively, to monolithic 3D multi-bit flops or flop trays.

BACKGROUND

Multi-bit flip-flops (also referred to as flop-trays) are large cells that realize the functionality of multiple flip-flops within one cell, with multiple data inputs and outputs but with a single clock. By sharing common resources (common clock and scan circuitry), flop-trays provide more power and area efficiency. However, their large size and high dynamic current draw (especially when most bits are flipping) are a detriment to the cell placement/routing as well as demands of a dynamic IR budget on the power supply grid.

Accordingly, there are long-felt industry needs for methods that improve upon conventional methods including the improved methods and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for a monolithic three dimensional (3D) multi-bit flip-flops that allows a multi-bit flop circuit to be fold in to two or more tiers. The monolithic 3D multi-bit flop provides a smaller cell footprint in a given tier (which making placement easier), distributed input/outputs (I/Os) across the tiers (easing routing congestion), and distributed devices across tiers (improving dynamic IR budget on the power grid).

In some examples of the disclosure, the systems, apparatus, and methods include a multi-bit flip-flop circuit having a plurality of single bit flip-flop circuits, each single bit flip-flop circuit of the plurality of single bit flip-flop circuits comprises a clocked portion driven by a clock signal and a non-clocked portion; a common clock circuit, each of the clocked portions of the plurality of single bit flip-flop circuits being connected to the common clock circuit; a common scan circuit, each of the non-clocked portions of the plurality of single bit flip-flop circuits are connected to the common scan circuit; and wherein the clocked portions of the plurality of single bit flip-flop circuits are in a first tier and the non-clocked portions of the plurality of single bit flip-flop circuits are in a second tier positioned above the first tier.

In some examples of the disclosure, the systems, apparatus, and methods include a multi-bit flip-flop circuit having a first plurality of flip-flop circuits and a second plurality of flip-flop circuits, wherein the first plurality of flip-flop circuits are positioned in a first tier and the second plurality of flip-flop circuits are positioned in a second tier above the first tier; a common clock circuit positioned in the first tier and connected to each of the first plurality of flip-flop circuits and each of the second plurality of flip-flop circuits; and a common scan circuit positioned in the second tier and connected to each of the first plurality of flip-flop circuits and each of the second plurality of flip-flop circuits.

Other features and advantages associated with the apparatus and methods disclosed herein will be apparent to those skilled in the art based on the accompanying drawings and detailed description.

BRIEF DESCRIPTION OF THE DRAWINGS

The accompanying drawings are presented to describe examples of the present teachings, and are not limiting. The accompanying drawings are presented to aid in the description of examples of the disclosure and are provided solely for illustration of the examples and not limitation thereof.

A more complete appreciation of aspects of the disclosure and many of the attendant advantages thereof will be readily obtained as the same becomes better understood by reference to the following detailed description when considered in connection with the accompanying drawings in which.

Figure 1:
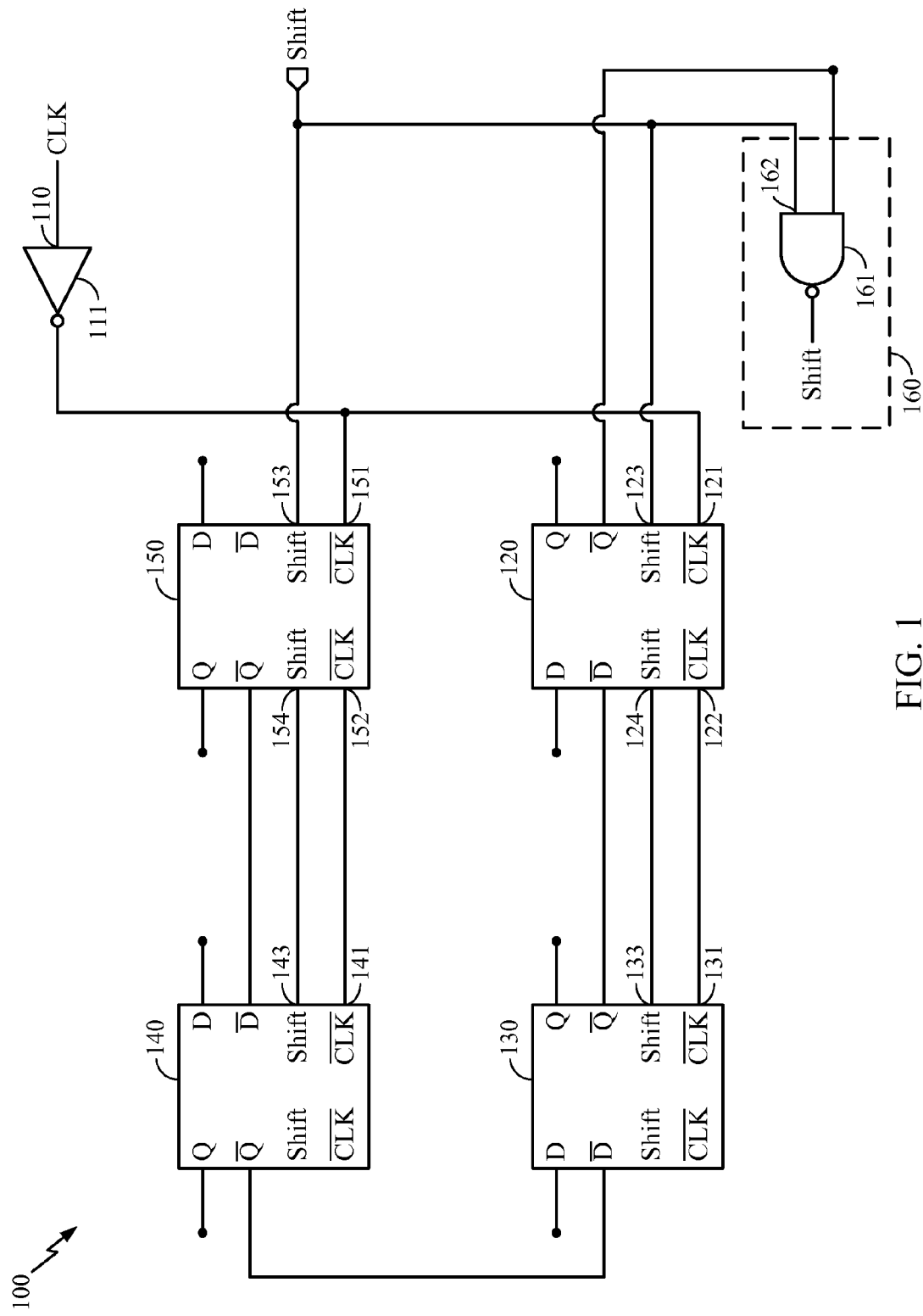
FIG. 1 depicts an exemplary block diagram of a multi-bit flip-flop.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Methods, apparatus and systems for a multi-bit flip-flop circuit are provided. For example, the multi-bit flip-flop circuit may be distributed in multiple tiers or layers, one above the other. In some examples, the multi-bit flip-flop circuit may include the clocked portions of the single bit flip-flops and a common clock circuit in one layer and the non-clocked portions of the single bit flip-flop and a common scan circuit in another layer above or below the first layer. In some examples, the multi-bit flip-flop circuit may include some of the single bit flip-flops and a common clock circuit in one layer and the other single bit flip-flops and a common scan circuit in another layer above or below the first layer. The exemplary methods, apparatus, and systems disclosed herein advantageously address the long-felt industry needs, as well as other previously unidentified needs, and mitigate shortcomings of the conventional methods, apparatus, and systems.

Various aspects are disclosed in the following description and related drawings to show specific examples relating to examples of the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any example described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

In accordance with some examples of the disclosure, FIG. 1 depicts a multi-bit flip-flop circuit. As shown in FIG. 1, a multi-bit flip-flop circuit 100 may include a common clock signal 110, a first single bit flip-flop 120, a second single bit flip-flop 130, a third single bit flip-flop 140, a fourth single bit flip-flop 150, and a common scan circuit 160. The common clock signal 110 includes an inverter 111 for producing an inverted clock signal. The inverted clock signal 111 may be coupled to an inverted clock signal input 121 of the first flip-flop 120 and an inverted clock signal input 151 of the fourth flip-flop 150. The common clock signal 110 and inverter 111 are common to the flip-flops in circuit 100 as opposed to the conventional approach of having separate clock signals and inverters for each flip-flop. Thus, the circuit 100 saves cell footprint space. The first flip-flop 120 may include an inverted clock signal output 122 that is coupled to a second flip-flop 130 inverted clock signal input 131. Similarly, the fourth flip-flop 150 may include an inverted clock signal output 152 that is coupled to a third flip-flop 140 inverted clock signal input 141. Thus, the inverted clock signal 110 is provided as a common input to each flip-flop 120, 130, 140, and 150.

The common scan circuit 160 may include shift logic 161 that produces a scan signal 162. The scan signal 162 may be coupled to a shift signal input 123 of the first flip-flop 120 and a shift signal input 153 of the fourth flip-flop 150. The common scan signal 162 and shift logic 161 are common to the flip-flops in circuit 100 as opposed to the conventional approach of having separate scan signals and shift logic for each flip-flop. Thus, circuit 100 saves cell footprint space. The first flip-flop 120 may include a shift signal output 124 that is coupled to a second flip-flop 130 shift signal input 133. Similarly, the fourth flip-flop 150 may include a shift signal output 154 that is coupled to a third flip-flop 140 shift signal input 143. Thus, the scan signal 162 is provided as a common input to each flip-flop 120, 130, 140, and 150.

Figure 2:
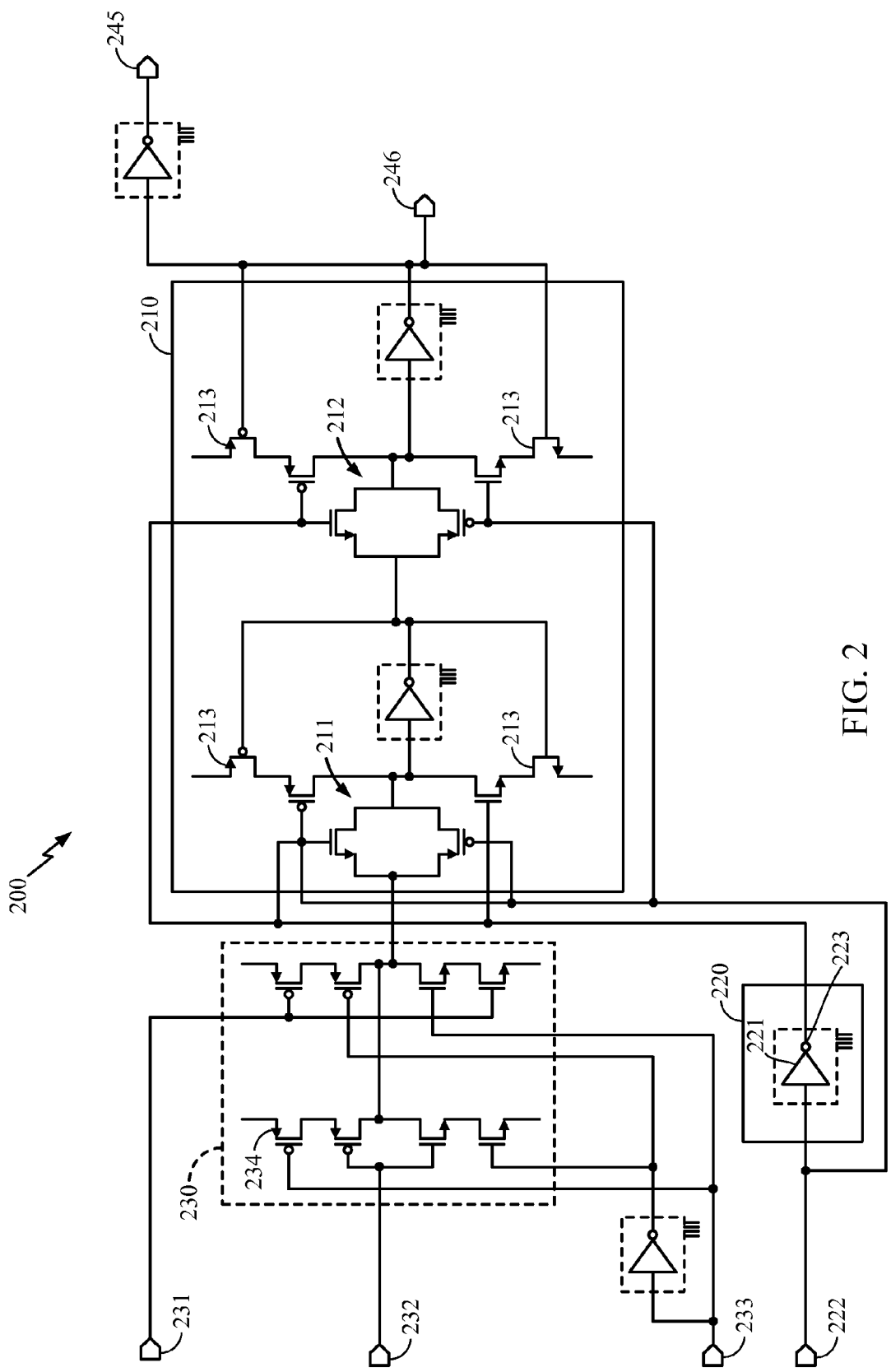
FIG. 2 depicts an exemplary schematic diagram of a bit flip-flop with clocked and non-clocked portions.

In accordance with some examples of the disclosure, FIG. 2 depicts a schematic of a single bit flip-flop with clocked portions and non-clocked portions. As shown in FIG. 2, a single bit flip-flop 200 may include a first clocked portion 210, a second clocked portion 220, and a non-clocked portion 230. The first clocked portion 210 comprises all the devices or components that input or are driven by the clock signal including the master latch 211, the slave latch 212, and the associated transmission gates 213. The second clocked portion 220 includes a local inverter 221. The local inverter 221 provides a complementary clock output of the clock input to be used within the single bit flip-flop 200. For example, if single bit flip-flop 200 includes an inverted clock signal 222, the inverter 221 provides a non-inverted clock signal 223 to complement the inverted clock signal input 222. The non-clocked portion 230 may include a data input 231, an inverted data input 232, a scan or shift logic input 233, and eight transistors 234. In addition to the data input 231 and inverted data input 232, bit flip-flop 200 includes an output (Q) 245 and an inverted output (not Q) 246.

Figure 3:
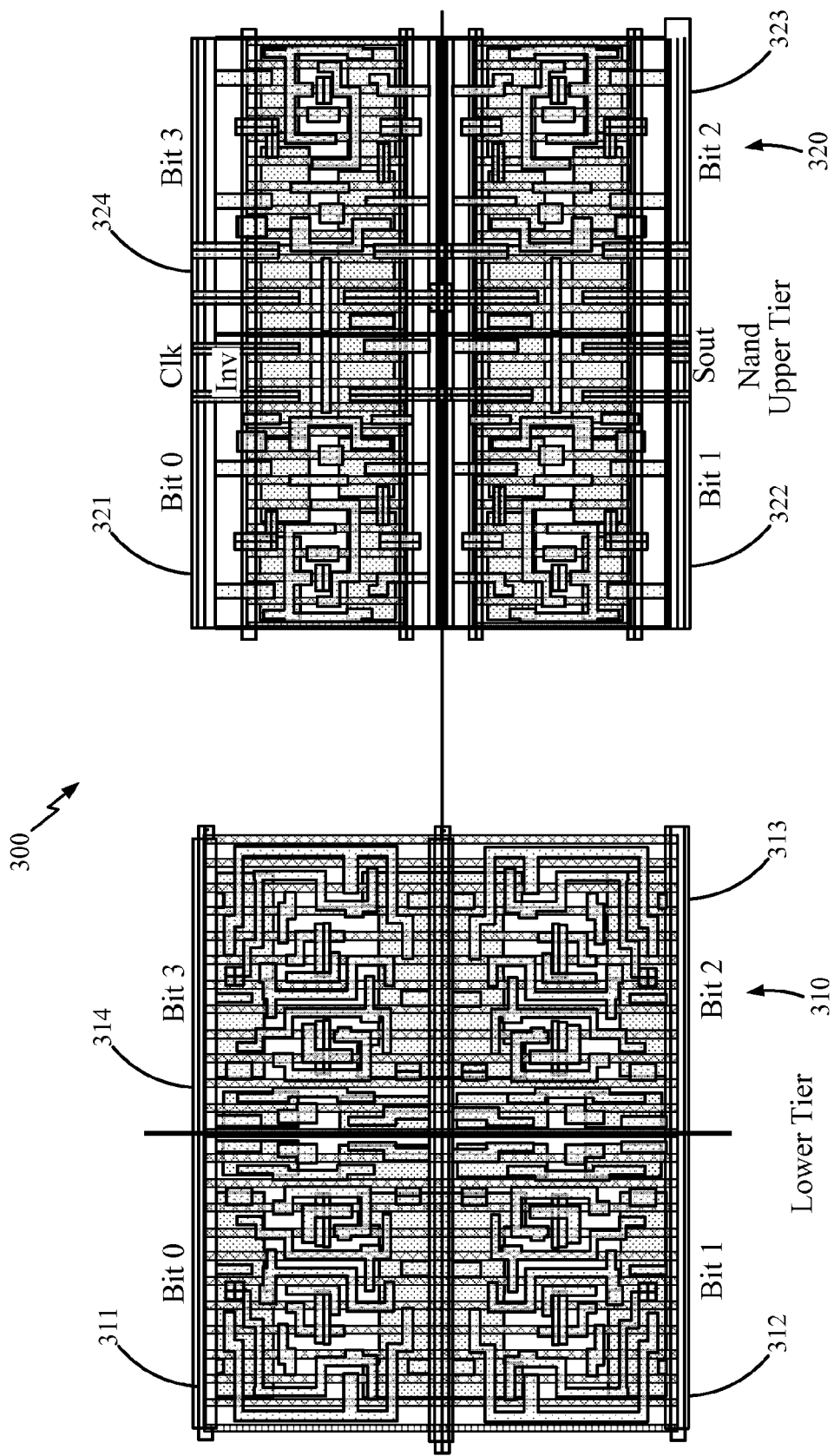
FIG. 3 depicts an exemplary two tier layout diagram of a multi-bit flip-flop.

In accordance with some examples of the disclosure, FIG. 3 depicts a two tier physical layout of a multi-bit flip-flop circuit. As shown in FIG. 3, a monolithic multi-bit flip-flop circuit 300 may include two active layers 310 and 320 in a single die with routing connections between the two layers as well as above the two layers (not shown). The first active layer 310 is in a lower tier and the second active layer 320 is in an upper tier vertically above the lower tier. By placing the second active layer 320 above the first active layer 310 instead of side by side, the cell footprint of the multi-bit flip-flop circuit 300 is reduced. Since the area occupied by the clocked portions is less than that occupied by the non-clocked portions, the cell footprint area reduction is less than half. For example, if clocked portions have a cell footprint area of 3.36 nanometers and the non-clocked portions have a cell footprint area of 2.72 nanometers, placing one layer above the other layer results in a cell footprint area reduction of 23% (FP=3.36*2.72=0.77x nanometers squared where x is the area of the side by side configuration).

The first active layer 310 may include the clocked portions of the multi-bit flip-flop 300 along with a common clock circuit or signal. For example, the first active layer 310 may include clocked portions of a first single bit flip-flop 311, clocked portions of a second single bit flip-flop 312, clocked portions of a third single bit flip-flop 313, clocked portions of a fourth single bit flip-flop 314, and a common clock circuit or signal (not shown). The second active layer 320 may include non-clocked portions of a first single bit flip-flop 321, non-clocked portions of a second single bit flip-flop 322, non-clocked portions of a third single bit flip-flop 323, non-clocked portions of a fourth single bit flip-flop 324, and a common scan circuit or shift signal (not shown). By placing the clocked portions in the same active tier, the manufacturing of the sensitive clocked portions of the circuit can be better controlled for uniformity and the routing connections can be more closely situated near the clock circuit reducing possible routing congestion. Also, by placing the non-clocked portions in the same active tier, the routing associated with the data inputs and the scan circuit or shift signal can be more closely situated near the portions that input those signals reducing possible routing congestion.

Figure 4:
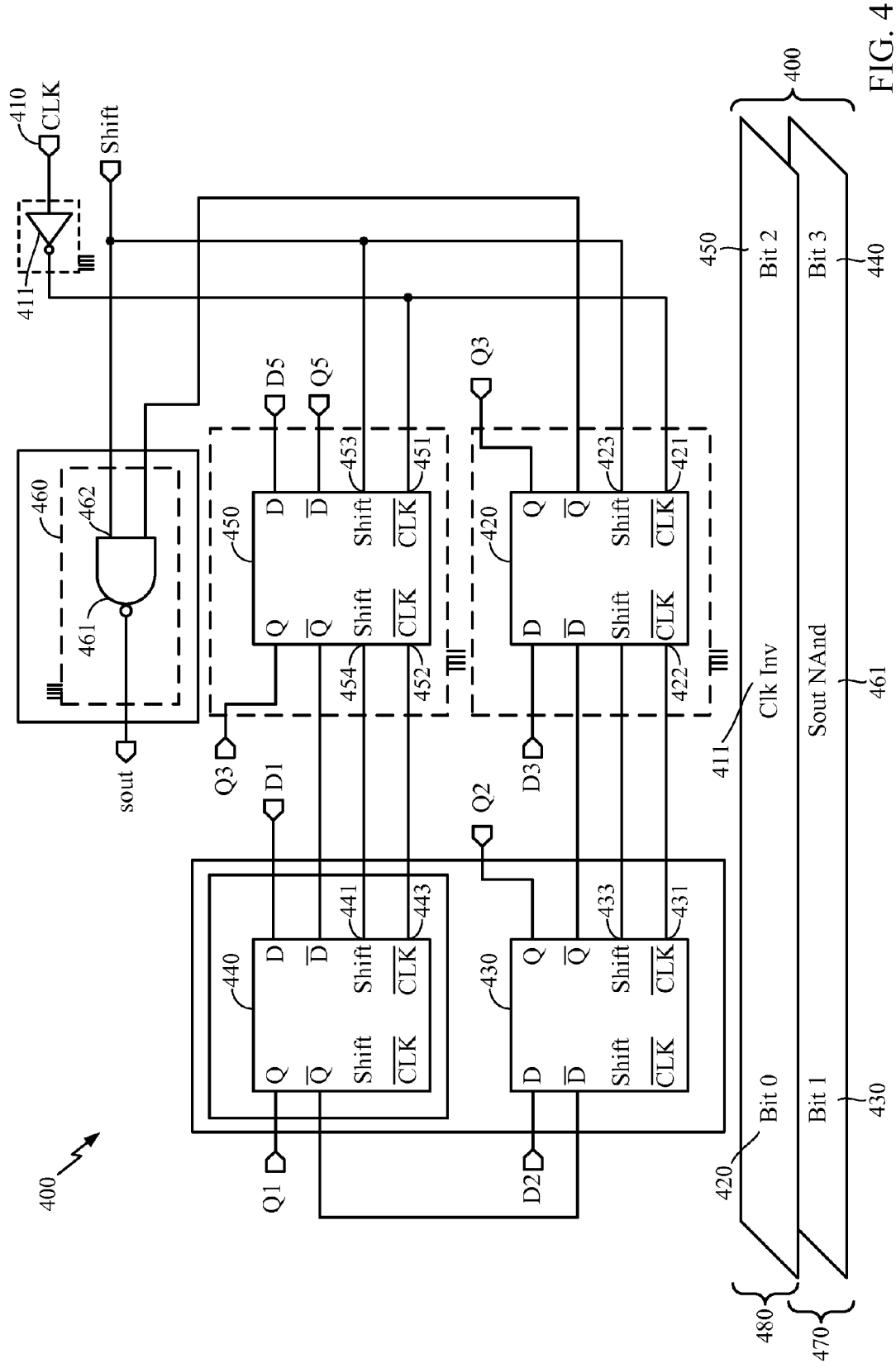
FIG. 4 depicts an exemplary two tier schematic diagram of a multi-bit flip-flop.

In accordance with some examples of the disclosure, FIG. 4 depicts a multi-bit flip-flop circuit. As shown in FIG. 4, a multi-bit flip-flop circuit 400 may include a common clock signal 410, a first single bit flip-flop 420, a second single bit flip-flop 430, a third single bit flip-flop 440, a fourth single bit flip-flop 450, and a common scan circuit 460. The common clock signal 410 includes an inverter 411 for producing an inverted clock signal. The inverted clock signal 411 may be coupled to an inverted clock signal input 421 of the first flip-flop 420 and an inverted clock signal input 451 of the fourth flip-flop 450. The common clock signal 410 and inverter 411 are common to the flip-flops in circuit 400 as opposed to the conventional approach of having separate clock signals and inverters for each flip-flop. Thus, the circuit 400 saves cell footprint space. The first flip-flop 420 may include an inverted clock signal output 422 that is coupled to a second flip-flop 430 inverted clock signal input 431. Similarly, the fourth flip-flop 450 may include an inverted clock signal output 452 that is coupled to a third flip-flop 440 inverted clock signal input 441. Thus, the inverted clock signal 410 is provided as a common input to each flip-flop 420, 430, 440, and 450.

The common scan circuit 460 may include shift logic 461 that produces a scan signal 462. The scan signal 462 may be coupled to a shift signal input 423 of the first flip-flop 420 and a shift signal input 453 of the fourth flip-flop 450. The common scan signal 462 and shift logic 461 are common to the flip-flops in circuit 400 as opposed to the conventional approach of having separate scan signals and shift logic for each flip-flop. Thus, circuit 400 saves cell footprint space. The first flip-flop 420 may include a shift signal output 424 that is coupled to a second flip-flop 430 shift signal input 433. Similarly, the fourth flip-flop 450 may include a shift signal output 454 that is coupled to a third flip-flop 440 shift signal input 443. Thus, the scan signal 462 is provided as a common input to each flip-flop 420, 430, 440, and 450.

The multi-bit flip-flop circuit 400 may be split into two active tiers—a first tier 470 and a second tier 480 above the first tier 470. The first tier 470 may include the second single bit flip-flop 430, the third single bit flip-flop 440, and the shift logic 461. The second tier 480 may include the first single bit flip-flop 420, the fourth single bit flip-flop 450, and the clock inverter 411. Routing (not shown) may be included between the first tier 470 and the second tier 480 to route signals as required.

Figure 5:
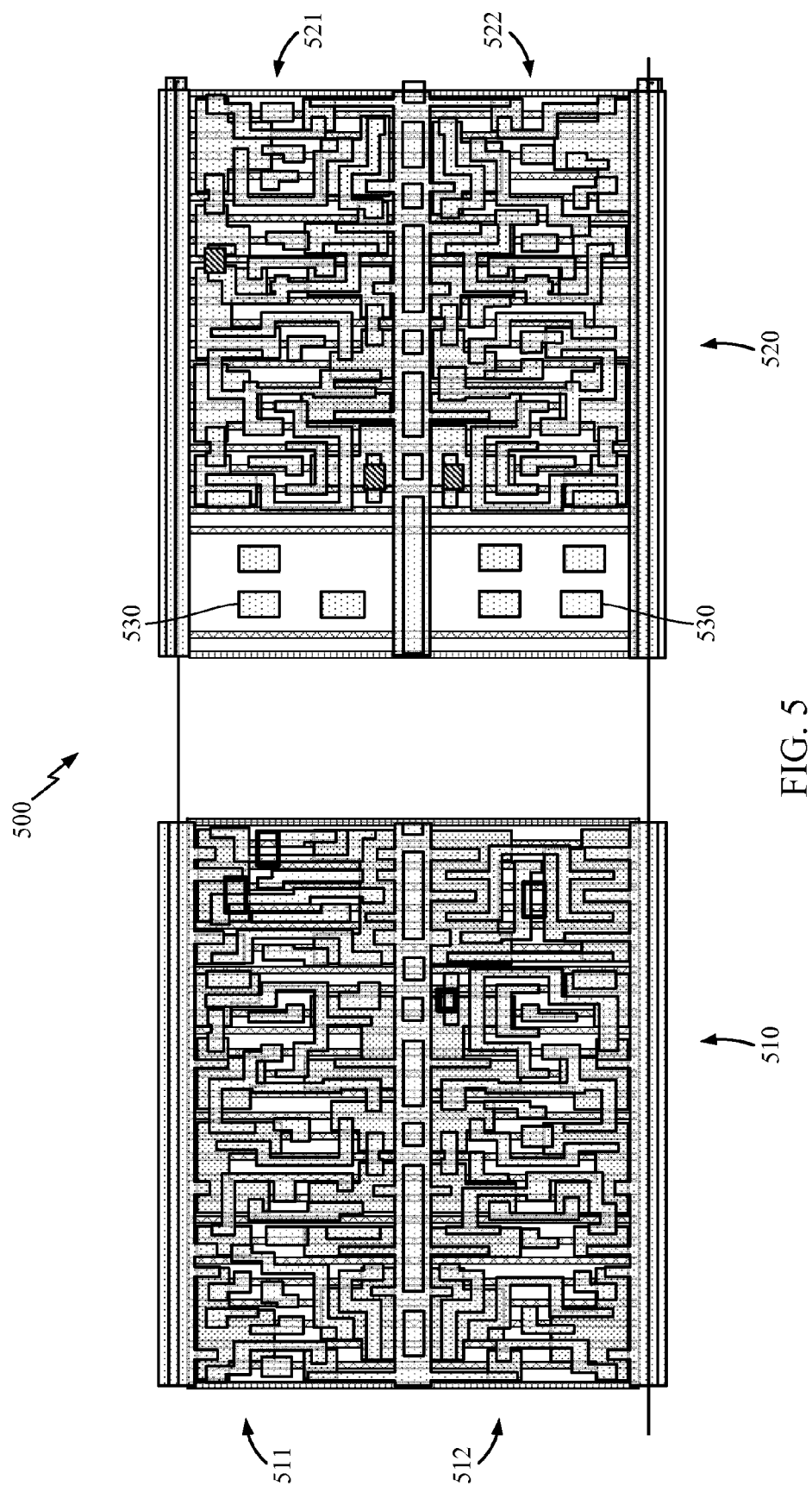
FIG. 5 depicts an exemplary two tier layout diagram of a multi-bit flip-flop.

In accordance with some examples of the disclosure, FIG. 5 depicts a two tier physical layout of a multi-bit flip-flop circuit. As shown in FIG. 5, a monolithic multi-bit flip-flop circuit 500 may include two active layers 510 and 520 in a single die with routing connections between the two layers as well as above the two layers (not shown). The first active layer 510 is in a lower tier and the second active layer 520 is in an upper tier vertically above the lower tier. By placing the second active layer 520 above the first active layer 510 instead of side by side, the cell footprint of the multi-bit flip-flop circuit 500 is reduced. Since the area occupied by the second tier 520 is less than that occupied by the first tier, the cell footprint area reduction is less than half. For example, if the second tier has a cell footprint area of 1.8 nanometers and the first tier has a cell footprint area of 3.78 nanometers, placing one layer above the other layer results in a cell footprint area reduction of 42.5% (FP=3.78*1.8=0.575x nanometers squared where x is the area of the side by side configuration).

The first active layer 510 may include two of the single bit flip-flop circuits of the multi-bit flip-flop 500 along with a common scan circuit or shift signal. For example, the first active layer 510 may include a first single bit flip-flop 511, a second single bit flip-flop 512, and a common scan circuit or shift signal (not shown). The second active layer 520 may include a third single bit flip-flop 521, a fourth single bit flip-flop 522, and a common clock circuit or signal (not shown). The multi-bit flip-flop 500 may include routing vias 530 that provide routing connections or pathways between the first tier 510 and the second tier 520 resulting in reduced routing congestion.

The previous examples depict a 4 bit multi-bit flip-flop circuit but it should be understood that more or less than 4 single bit flip-flops may be used.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

The examples described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. An integrated circuit, comprising:
    a multi-bit flip-flop circuit with a plurality of single bit flip-flop circuits, each single bit flip-flop circuit of the plurality of single bit flip-flop circuits comprises a clocked portion driven by a clock signal and a non-clocked portion;
    a common clock circuit, each of the clocked portions of the plurality of single bit flip-flop circuits being connected to the common clock circuit;
    a common scan circuit, each of the non-clocked portions of the plurality of single bit flip-flop circuits are connected to the common scan circuit;
    wherein the clocked portions of the plurality of single bit flip-flop circuits are in a first tier and each of the clocked portions comprises a master latch component, a slave latch component, and a plurality of transmission gates; and
    wherein the non-clocked portions of the plurality of single bit flip-flop circuits are in a second tier positioned above the first tier and each of the non-clocked portions comprises a data input, an inverted data input, a scan input, and a plurality of input/output transistors.

2. The integrated circuit of claim 1, wherein the multi-bit flip-flop circuit is a four bit flip-flop circuit.

3. The integrated circuit of claim 2, wherein the plurality of single bit flip-flop circuits comprises a first single bit flip-flop circuit directly coupled to the common clock circuit, a second single bit flip-flop circuit coupled to the first single bit flip-flop circuit, a third single bit flip-flop circuit coupled to the second single bit flip-flop circuit, and a fourth single bit flip-flop circuit coupled to the third single bit flip-flop circuit and directly coupled to the common clock circuit.

4. The integrated circuit of claim 3, wherein the first single bit flip-flop circuit and the fourth single bit flip-flop circuit are directly coupled to the common scan circuit.

5. The integrated circuit of claim 4, wherein the first single bit flip-flop circuit has an inverted output directly coupled to the common scan circuit.

6. The integrated circuit of claim 5, wherein an inverted input of the first single bit flip-flop circuit is directly coupled to an inverted output of the second single bit flip-flop circuit.

7. The integrated circuit of claim 6, wherein an inverted input of the second single bit flip-flop circuit is directly coupled to an inverted output of the third single bit flip-flop circuit.

8. The integrated circuit of claim 7, wherein an inverted input of the third single bit flip-flop circuit is directly coupled to an inverted output of the fourth single bit flip-flop circuit.

9. The integrated circuit of claim 8, further comprising routing pathways coupling the first tier to the second tier.

10. An integrated circuit, comprising:
    a multi-bit flip-flop circuit with a first plurality of flip-flop circuits and a second plurality of flip-flop circuits, wherein the first plurality of flip-flop circuits are positioned in a first tier and the second plurality of flip-flop circuits are positioned in a second tier above the first tier;
    a common clock circuit positioned in the first tier and connected to each of the first plurality of flip-flop circuits and each of the second plurality of flip-flop circuits;

a common scan circuit positioned in the second tier and connected to each of the first plurality of flip-flop circuits and each of the second plurality of flip-flop circuits;

wherein each of the first plurality of flip-flop circuits and each of the second plurality of flip-flop circuits comprises a clocked portion and a non-clocked portion;

wherein each clocked portion comprises a master latch component, a slave latch component, and a plurality of transmission gates; and wherein each non-clocked portion comprises a data input, an inverted data input, a scan input, and a plurality of input/output transistors.

11. The integrated circuit of claim 10, wherein the multi-bit flip-flop circuit is a four bit flip-flop circuit, the first plurality of flip-flop circuits comprises a second single bit flip-flop circuit and a fourth single bit flip-flop circuit, and the second plurality of flip-flop circuits comprises a first single bit flip-flop circuit and a third single bit flip-flop circuit.

12. The integrated circuit of claim 11, wherein the first single bit flip-flop circuit is directly coupled to the common clock circuit, the second single bit flip-flop circuit is coupled to the first single bit flip-flop circuit, the third single bit flip-flop circuit is coupled to the second single bit flip-flop circuit, and the fourth single bit flip-flop circuit is coupled to the third single bit flip-flop circuit and directly coupled to the common clock circuit.

13. The integrated circuit of claim 12, wherein the first single bit flip-flop circuit and the fourth single bit flip-flop circuit are directly coupled to the common scan circuit.

14. The integrated circuit of claim 13, wherein the first single bit flip-flop circuit has an inverted output directly coupled to the common scan circuit.

15. The integrated circuit of claim 14, wherein an inverted input of the first single bit flip-flop circuit is directly coupled to an inverted output of the second single bit flip-flop circuit.

16. The integrated circuit of claim 15, wherein an inverted input of the second single bit flip-flop circuit is directly coupled to an inverted output of the third single bit flip-flop circuit.

17. The integrated circuit of claim 16, wherein an inverted input of the third single bit flip-flop circuit is directly coupled to an inverted output of the fourth single bit flip-flop circuit.

18. The integrated circuit of claim 17, further comprising routing pathways coupling the first tier to the second tier.

* * * * *